United States Patent
Song et al.

(10) Patent No.: US 9,024,684 B2
(45) Date of Patent: May 5, 2015

(54) AREA-EFFICIENT PLL WITH A LOW-NOISE LOW-POWER LOOP FILTER

(71) Applicant: QUALCOMM Incorporated, San Diego, CA (US)

(72) Inventors: Yu Song, San Diego, CA (US); Nan Chen, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 98 days.

(21) Appl. No.: 13/831,639

(22) Filed: Mar. 15, 2013

(65) Prior Publication Data
US 2014/0266343 A1    Sep. 18, 2014

(51) Int. Cl.
| | | |
|---|---|---|
| H03B 1/00 | (2006.01) | |
| H03K 5/00 | (2006.01) | |
| H04B 1/10 | (2006.01) | |
| H03L 7/08 | (2006.01) | |
| H03L 7/087 | (2006.01) | |
| H03L 7/089 | (2006.01) | |
| H03L 7/093 | (2006.01) | |

(52) U.S. Cl.
CPC .............. *H03L 7/0802* (2013.01); *H03L 7/087* (2013.01); *H03L 7/0891* (2013.01); *H03L 7/0893* (2013.01); *H03L 7/093* (2013.01)

(58) Field of Classification Search
USPC .................................. 327/551–559, 156–161
See application file for complete search history.

(56) References Cited

U.S. PATENT DOCUMENTS

| | | | | |
|---|---|---|---|---|
| 4,769,612 | A | * | 9/1988 | Tamakoshi et al. ............ 327/554 |
| 6,191,648 | B1 | * | 2/2001 | Lewicki ......................... 327/554 |
| 6,313,668 | B1 | * | 11/2001 | Savage ............................. 327/94 |
| 6,420,917 | B1 | | 7/2002 | Klemmer |
| 6,611,160 | B1 | * | 8/2003 | Lee et al. ........................ 327/157 |
| 6,917,192 | B1 | | 7/2005 | Xin-LeBlanc et al. |
| 6,998,923 | B2 | | 2/2006 | Melanson |
| 7,629,854 | B2 | | 12/2009 | Lin et al. |
| 7,719,328 | B2 | | 5/2010 | Fu |
| 2005/0218998 | A1 | | 10/2005 | Lim |
| 2007/0126514 | A1 | | 6/2007 | Lin |
| 2008/0116966 | A1 | * | 5/2008 | Chae et al. ..................... 327/554 |
| 2012/0268178 | A1 | | 10/2012 | Reddy |

OTHER PUBLICATIONS

Lim P.J., "An Area-Efficient PLL Architecture in 90-nm CMOS", 2005 Symposium on VLSI Circuits Digest of Technical Papers, 2005, pp. 48-49.

(Continued)

*Primary Examiner* — Quan Tra
(74) *Attorney, Agent, or Firm* — Novak Druce Connolly Bove + Quigg LLP

(57) ABSTRACT

Techniques for reducing noise and power consumption in a loop filter for a phase-locked loop (PLL) are described herein. In one embodiment, a loop filter for a PLL comprises a first proportional capacitor, a second proportional capacitor, an active device, and a plurality of switches. The plurality of switches are configured to alternately couple the first proportional capacitor and the second proportional capacitor to a first charge pump, to alternately couple noise from the active device to the first proportional capacitor and the second proportional capacitor, and to alternately couple the first proportional capacitor and the second proportional capacitor into a feedback circuit, wherein the feedback circuit produces an output voltage of the loop filter.

20 Claims, 8 Drawing Sheets

(56) References Cited

OTHER PUBLICATIONS

Song, et al., "A High-Performance PLL With a Low-Power Active Switched-Capacitor Loop Filter", IEEE Transactions on Circuits and Systems—II: Express Briefs, vol. 58, No. 9, Sep. 2011, pp. 555-559.

Song, et al., "A low-power active switched-capacitor loop filter for phase locked loops," Proceedings of 2010 IEEE International Symposium on Circuits and Systems (ISCAS), 2010, pp. 1316-1319.

International Search Report and Written Opinion—PCT/US2014/023829—ISA/EPO—Jun. 25, 2014.

* cited by examiner

Phase Φ1o

Phase Φ2o

Phase Φ1e

Phase Φ2e

AREA-EFFICIENT PLL WITH A LOW-NOISE LOW-POWER LOOP FILTER

BACKGROUND

1. Field

Aspects of the present disclosure relate generally to phase-locked loops (PLLs), and more particularly, to reducing the noise and power consumption in a switched-capacitor loop filter for a PLL.

2. Background

A phase-locked loop (PLL) is a closed-loop frequency-control system that adjusts the frequency of an output signal to minimize the phase or frequency difference between a reference signal and a feedback signal. The feedback signal may be generated by passing the output signal through a frequency divider. PLLs are widely used to provide signals having a desired frequency and/or phase in wireless communication systems, micro-processing systems, and high-speed data conversion systems.

A PLL typically comprises a loop filter to stabilize the PLL and/or reduce jitter. The loop filter may be implemented using a resistor-capacitor (RC) loop filter. However, the capacitor in an RC loop filter typically consumes a large chip area, and therefore may not be suitable for circuit integration. Alternatively, the loop filter may be implemented using an active switched-capacitor loop filter. An advantage of using an active switched-capacitor loop filer is that it requires less space than an RC loop filter, making the PLL more area efficient. However, an active switch-capacitor loop filter may experience noise and high power consumption caused by active elements in the active switched-capacitor loop filter.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

According to an aspect, a loop filter for a PLL is provided. The loop filter comprises a first proportional capacitor, a second proportional capacitor, an active device, and a plurality of switches. The plurality of switches are configured to alternately couple the first proportional capacitor and the second proportional capacitor to a first charge pump, to alternately couple noise from the active device to the first proportional capacitor and the second proportional capacitor, and to alternately couple the first proportional capacitor and the second proportional capacitor into a feedback circuit, wherein the feedback circuit produces an output voltage of the loop filter.

A second aspect relates to a method for operating a loop filter. The loop filter comprises a first proportional capacitor, a second proportional capacitor, and an active device. The method comprises alternately coupling the first proportional capacitor and the second proportional capacitor to a first charge pump, alternately coupling noise from the active device to the first proportional capacitor and the second proportional capacitor, and alternately coupling the first proportional capacitor and the second proportional capacitor into a feedback circuit, wherein the feedback circuit produces an output voltage of the loop filter.

A third aspect relates to an apparatus for operating a loop filter. The loop filter comprises a first proportional capacitor, a second proportional capacitor, and an active device. The apparatus comprises means for alternately coupling the first proportional capacitor and the second proportional capacitor to a first charge pump, means for alternately coupling noise from the active device to the first proportional capacitor and the second proportional capacitor, and means for alternately coupling the first proportional capacitor and the second proportional capacitor into a feedback circuit, wherein the feedback circuit produces an output voltage of the loop filter.

To the accomplishment of the foregoing and related ends, the one or more embodiments comprise the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the described embodiments are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
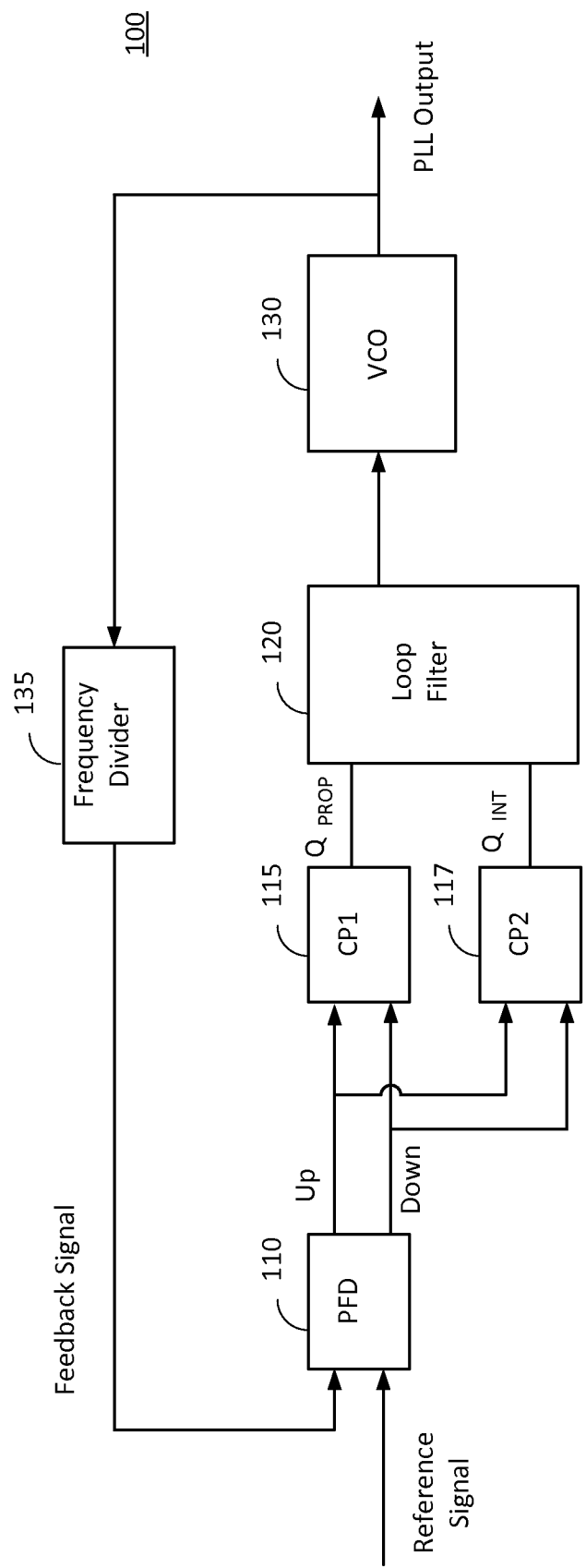
FIG. 1 shows an example of a phase-locked loop (PLL) with a loop filter.

FIG. 1 shows an example of a phase-locked loop (PLL) 100. The PLL comprises a phase frequency detector (PFD) 110, a first charge pump 115, a second charge pump 117, a loop filter 120, a voltage-controlled oscillator (VCO) 130, and a frequency divider 135.

The output of the VCO 130 provides the output signal for the PLL 100, in which the frequency of the output signal is controlled by adjusting an input voltage to the VCO 130, as discussed further below. The output signal is fed back to the PFD 110 of the PLL 100 through the frequency divider 135. The frequency divider 135 divides the frequency of the output signal by N to produce a feedback signal having a frequency equal to $f_{out}/N$, where $f_{out}$ is the frequency of the output signal.

The feedback signal and the reference signal are input to the PFD 110, which detects the phase difference between the reference signal and the feedback signal. The PFD 110 outputs an UP signal and a DOWN signal based on the phase difference in each comparison between the feedback and the reference signal. For example, when the phase of the reference signal leads the feedback signal, the UP signal may comprise a pulse having a width that is proportional to the phase difference. When the phase of the feedback signal leads the reference signal, the DOWN signal may comprise a pulse having a width that is proportional to the phase difference.

During each update cycle, the first charge pump 115 produces a proportional charge $Q_{PROP}$ based on the UP and DOWN signals in the cycle, and the second charge pump 117 produces an integral charge $Q_{INT}$ based on the UP and DOWN signals in the cycle. Each update cycle may include an up update or a down update depending on whether the phase of the reference signal is leading or lagging the feedback signal. When the loop filter 120 locks onto the reference signal, each update cycle may approximately equal one cycle of the reference signal. The proportional charge $Q_{PROP}$ and the integral charge $Q_{INT}$ are input to the loop filter 120, which converts the charges into a change in the voltage input to the VCO 130. The voltage change adjusts the output frequency of the VCO 130. When the PLL 100 locks onto the frequency of the reference signal, the output signal has a frequency approximately equal to N times the frequency of the reference signal due to the frequency divider 135 in the feedback path of the PLL 100.

Figure 2:
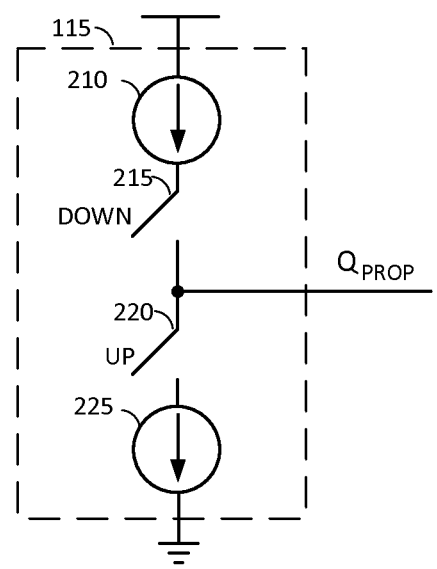
FIG. 2 shows an example of charge pumps.
Figure 2:
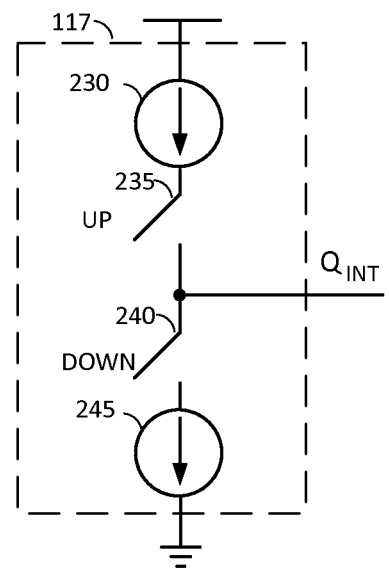

FIG. 2 shows an example of the first and second charge pumps 115 and 117. The first charge pump 115 comprises first and second current sources 210 and 225, and first and second switches 215 and 220 controlled by the UP and DOWN signals. The first switch 215 is between the first current source 210 and the output of the first charge pump 115, and the second switch 220 is between the output of the first charge pump 115 and the second current source 225. The first switch 215 is closed when the DOWN signal is logic one, and open when the DOWN signal is logic zero. As a result, the first current source 210 injects a charge of $Q_{PROP}$ into the loop filter 120 during one cycle when the DOWN signal is logic one. The second switch 225 is closed when the UP signal is logic one, and open when the UP signal is logic zero. As a result, the second current source 225 discharges the loop filter 120 by a charge of $Q_{PROP}$ during one cycle when the UP signal is logic one.

The second charge pump 117 comprises third and fourth current sources 230 and 245, and third and fourth switches 235 and 240 controlled by the UP and DOWN signals. The third switch 235 is between the third current source 230 and the output of the second charge pump 117, and the fourth switch 240 is between the output of the second charge pump 117 and the fourth current source 245. The third switch 235 is closed when the UP signal is logic one, and open when the UP signal is logic zero. As a result, the third current source 230 injects a charge of $Q_{INT}$ into the loop filter 120 during one cycle when the UP signal is logic one. The fourth switch 245 is closed when the DOWN signal is logic one, and open when the DOWN signal is logic zero. As a result, the fourth current source 245 discharges the loop filter 120 by a charge of $Q_{INT}$ during one cycle when the DOWN signal is logic one.

The loop filter 120 may be implemented using an active switched-capacitor loop filter. An advantage of using an active switched-capacitor loop filer is that it requires less space than a resistor-capacitor (RC) loop filter, making the PLL more area efficient. However, an active switched-capacitor loop filter may experience noise and high power consumption caused by active elements in the active switched-capacitor loop filter. Accordingly, it is desirable to reduce noise and power consumption in an active switched-capacitor loop filter.

Figure 3:
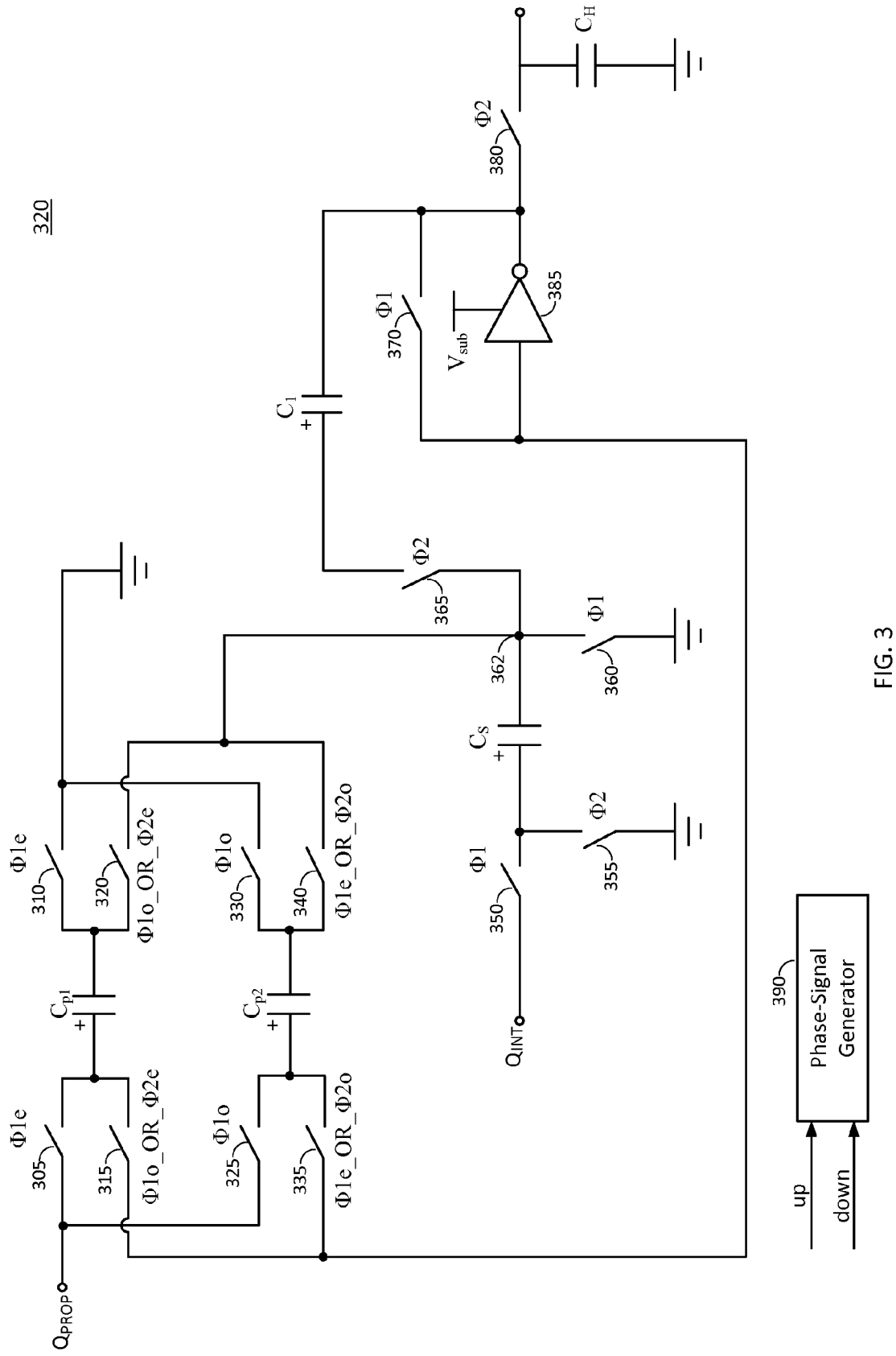
FIG. 3 shows a switched-capacitor loop filter according to an embodiment of the present disclosure.

FIG. 3 shows an active switched-capacitor loop filter 320 that can be used to implement the loop filter 120 in FIG. 1 according to an embodiment of the present invention. The loop filter 320 comprises a first proportional capacitor $C_{P1}$, a second proportional capacitor $C_{P2}$, an integral capacitor $C_S$, a feedback capacitor $C_I$, an output hold capacitor $C_H$, an inverter 385, and switches for reconfiguring the connections in the loop filter 320.

Figure 4:
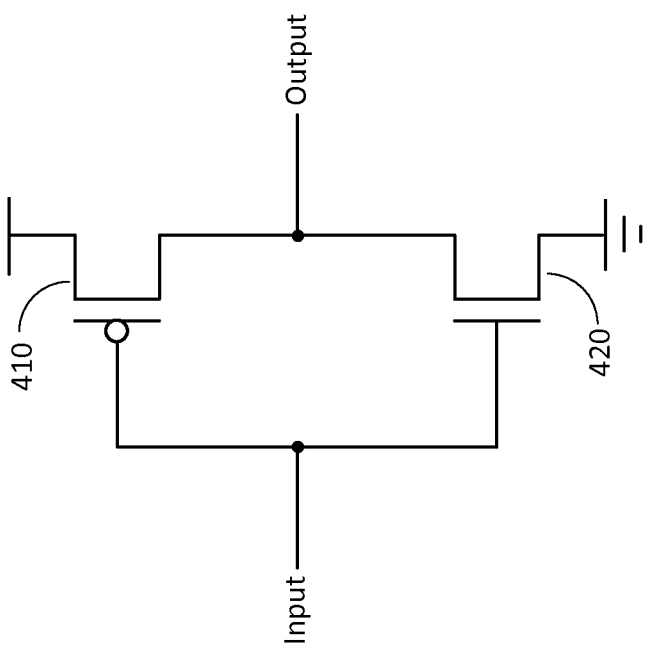
FIG. 4 shows an example of an inverter that can be used in embodiments of the present disclosure.

The inverter 385 may be implemented using a complimentary-pair inverter 485, an example of which is shown in FIG. 4. The complimentary-pair inverter 485 comprises a P-type metal-oxide-semiconductor (PMOS) transistor 410 and an N-type metal-oxide-semiconductor (NMOS) transistor 420. The source of the PMOS transistor 410 is coupled to a power supply, the source of the NMOS transistor 420 is coupled to ground, the drains of the PMOS and NMOS transistors 410 and 420 are coupled to the output of the inverter 485, and the gates of the PMOS and NMOS transistors 410 and 420 are coupled to the input of the inverter 485.

Figure 5:
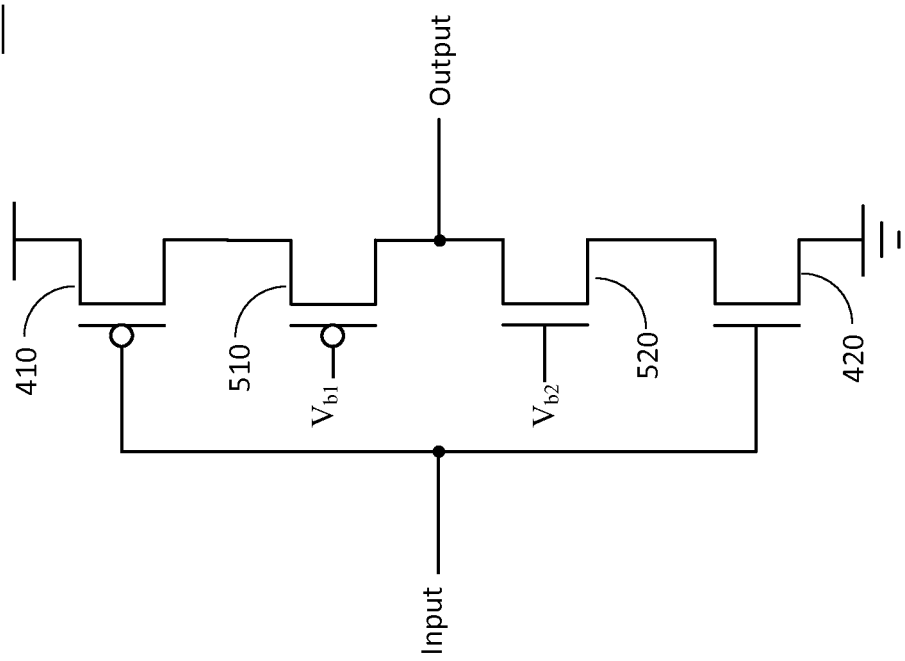
FIG. 5 shows another example of an inverter that can be used in embodiments of the present disclosure.

The inverter 385 may also be implemented using the inverter 585 shown in FIG. 5. The inverter 585 is similar to the complimentary-pair inverter 485 in FIG. 4, and further includes a common-gate PMOS transistor 510 coupled between the drain of the PMOS transistor 410 and the output of the inverter 585, and a common-gate NMOS transistor 520 coupled between the output of the inverter 585 and the drain of the NMOS transistor 420. The gate of the common-gate PMOS transistor 510 is biased by DC voltage $V_{b1}$ and the gate of the common-gate NMOS transistor 520 is biased by DC voltage $V_{b2}$.

Returning to FIG. 3, the switches in the loop filter 320 include a first switch 305 for selectively coupling one terminal of the first proportional capacitor $C_{P1}$ to the first charge pump 115, and a second switch 310 for selectively coupling the other terminal of the first proportional capacitor $C_{P1}$ to ground. The switches also include a third switch 315 for selectively coupling the one terminal of the first proportional capacitor $C_{P1}$ to the input of the inverter 385, and a fourth switch 320 for selectively coupling the other terminal of the first proportional capacitor $C_{P1}$ to node 362.

The switches also include a fifth switch 325 for selectively coupling one terminal of the second proportional capacitor $C_{P2}$ to the first charge pump 115, and a sixth switch 330 for selectively coupling the other terminal of the second proportional capacitor $C_{P2}$ to ground. The switches also include a seventh switch 335 for selectively coupling the one terminal of the second proportional capacitor $C_{P2}$ to the input of the inverter 385, and an eighth switch 340 for selectively coupling the other terminal of the second proportional capacitor $C_{P2}$ to node 362.

The switches further include a ninth switch 350 for selectively coupling one terminal of the integral capacitor $C_S$ to the second charge pump 117. The other terminal of the integral capacitor $C_S$ is coupled to node 362. The switches further include a tenth switch 355 for selectively coupling the one terminal of the integral capacitor $C_S$ to ground, and an eleventh switch 360 for selectively coupling node 362 to ground.

The switches further include a twelfth switch 365 for selectively coupling one terminal of the feedback capacitor $C_1$ to node 362. The other terminal of the feedback capacitor $C_1$ is coupled to the output of the inverter 385. The switches further include a thirteenth switch 370 for selectively coupling the output and the input of the inverter 385 together to short the output and input of the inverter 385.

The switches further include a fourteenth switch 380 for selectively coupling the output of the inverter 385 to the output capacitor $C_H$. The voltage across the output capacitor $C_H$ is input to the VCO 130 to control the frequency of the VCO 130. The switches may be implemented using a CMOS pass gate comprising a PMOS transistor and an NMOS transistor coupled in parallel, or another type of switch.

Switching of the switches in the loop filter 320 is controlled by a plurality of phase signals generated by a phase-signal generator 390 based on the UP and DOWN signals. For ease of illustration, the individual connections between the phase-signal generator 390 and the switches are not shown in FIG. 3. The phase signals define four different phases $\Phi 1o$, $\Phi 2o$, $\Phi 1e$ and $\Phi 2e$ of switching, in which the connections in the loop filter 320 are different for each phase and the four phases repeat every two consecutive update cycles. Each update cycle may include an up or down update.

In this regard, FIGS. 6A-6D show the connections in the loop filter 320 for the four different phases $\Phi 1o$, $\Phi 2o$, $\Phi 1e$ and $\Phi 2e$. Phases $\Phi 1o$ and $\Phi 2o$ correspond to a first cycle (denoted cycle n in FIGS. 6A and 6B) of two consecutive updates, and phases $\Phi 1e$ and $\Phi 2e$ correspond to a second cycle (denoted cycle n+1 in FIGS. 6C and 6D) of two consecutive updates. The connections shown in FIGS. 6A-6D repeat every two consecutive update cycles.

Figure 6A:
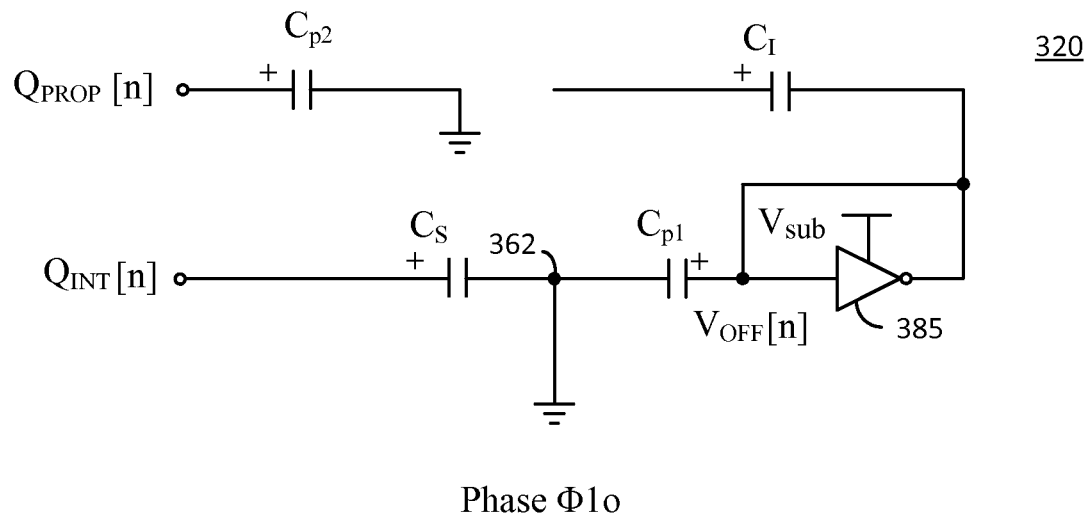
FIGS. 6A-6D show different connections for a switched-capacitor loop filter during different phases according to an embodiment of the present disclosure.
Figure 6B:
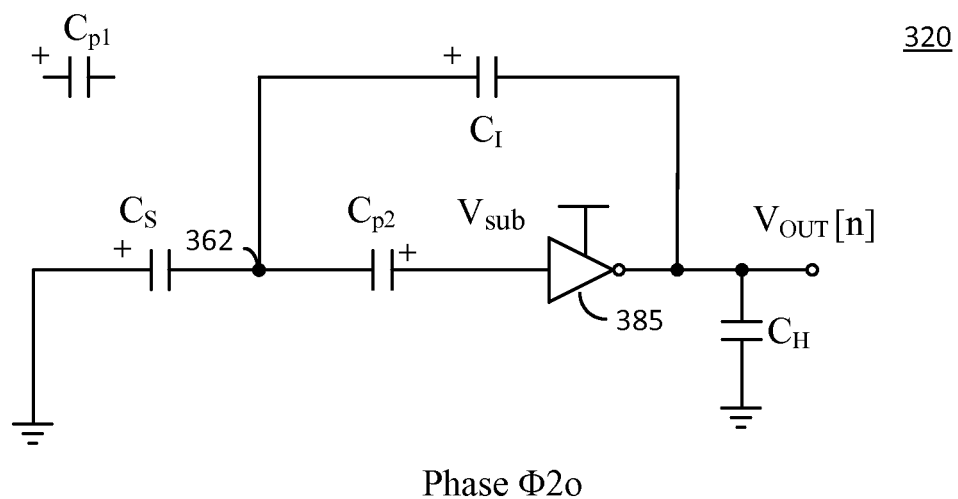
Figure 6C:
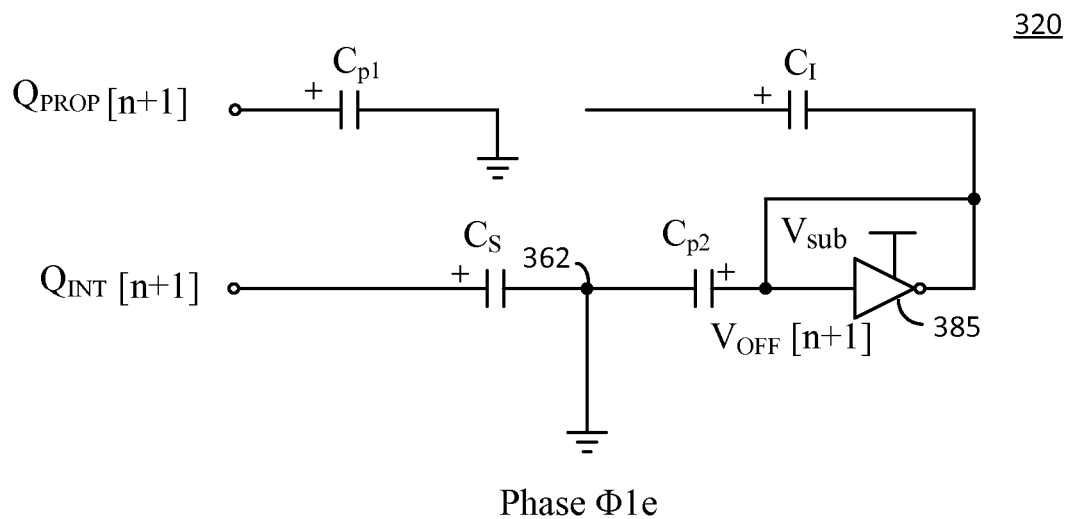

As shown in FIGS. 6A and 6C, the switches alternatively couple the proportional capacitors $C_{P1}$ and $C_{P2}$ to the first charge pump 115. For example, in phase $\Phi 1o$ of cycle n (shown in FIG. 6A), switches 325 and 330 are closed to couple the second proportional capacitor $C_{P2}$ between the first charge pump 115 and ground. The first charge pump 115 charges or discharges the second proportional capacitor $C_{P2}$ by $Q_{PROP}[n]$ depending on the polarity of $Q_{PROP}[n]$. In phase $\Phi 1e$ of cycle n+1 (shown in FIG. 6C), switches 305 and 310 are closed to couple the first proportional capacitor $C_{P1}$ between the first charge pump 115 and ground. The first charge pump 115 charges or discharges the first proportional capacitor $C_{P1}$ by $Q_{PROP}[n+1]$ depending on the polarity of $Q_{PROP}[n+1]$. Thus, the first and second proportional capacitor $C_{P1}$ and $C_{P2}$ are coupled to the first charge pump 115 in alternate update cycles.

As also shown in FIGS. 6A and 6C, the switches alternatively reset the voltages across the proportional capacitors $C_{P1}$ and $C_{P2}$ to an offset voltage (denoted $V_{OFF}$) of the inverter 385. The offset voltage $V_{OFF}$ is obtained by shorting the input and output of the inverter 385. The input and output of the inverter 385 are shorted by closing switch 370. For example, in phase $\Phi 1o$ of cycle n (shown in FIG. 6A), switches 315, 320 and 360 are closed to couple the first proportional capacitor $C_{P1}$ between the input of the inverter 385 and ground. Since the input and output of the inverter 385 are shorted, this resets the voltage of the first proportional capacitor $C_{P1}$ to $V_{OFF}[n]$. In phase $\Phi 1e$ of cycle n+1 (shown in FIG. 6C), switches 335, 340 and 360 are closed to couple the second proportional capacitor $C_{P2}$ between the input of the inverter 385 and ground. Since the input and output of the inverter 385 are shorted, this resets the voltage of the second proportional capacitor $C_{P2}$ to $V_{OFF}[n+1]$. Thus, the voltages of the first and second proportional capacitor $C_{P1}$ and $C_{P2}$ are reset to the offset voltage $V_{OFF}$ in alternate update cycles.

The offset voltage $V_{OFF}$ includes flicker noise due to the active elements (e.g., transistors 410 and 420) in the inverter 385, and therefore couples noise from the inverter 385 to the proportional capacitors. The proportional capacitors alternate between being coupled to the first charge pump 115 and being reset to the offset voltage $V_{OFF}$ of the inverter 385 such that when one of the proportional capacitors is coupled to the first charge pump 115, the other proportional capacitor is being reset to the offset voltage $V_{OFF}$, and vice versa.

As shown in FIGS. 6A and 6C, in each update cycle, the switches couple the integral capacitor $C_S$ between the second charge pump 117 and ground by closing switches 350 and 360. Thus, the integral capacitor $C_S$ is charged or discharged by the second charge pump 117 during each cycle. In phase $\Phi 1o$ of cycle n (shown in FIG. 6A), the second charge pump 117 charges or discharges the integral capacitor $C_S$ by $Q_{INT}[n]$ depending on the polarity of $Q_{INT}[n]$. In phase $\Phi 1e$ of cycle n+1 (shown in FIG. 6C), the second charge pump 117 charges or discharges the integral capacitor $C_S$ by $Q_{INT}[n+1]$ depending on the polarity of $Q_{INT}[n+1]$.

Figure 6D:
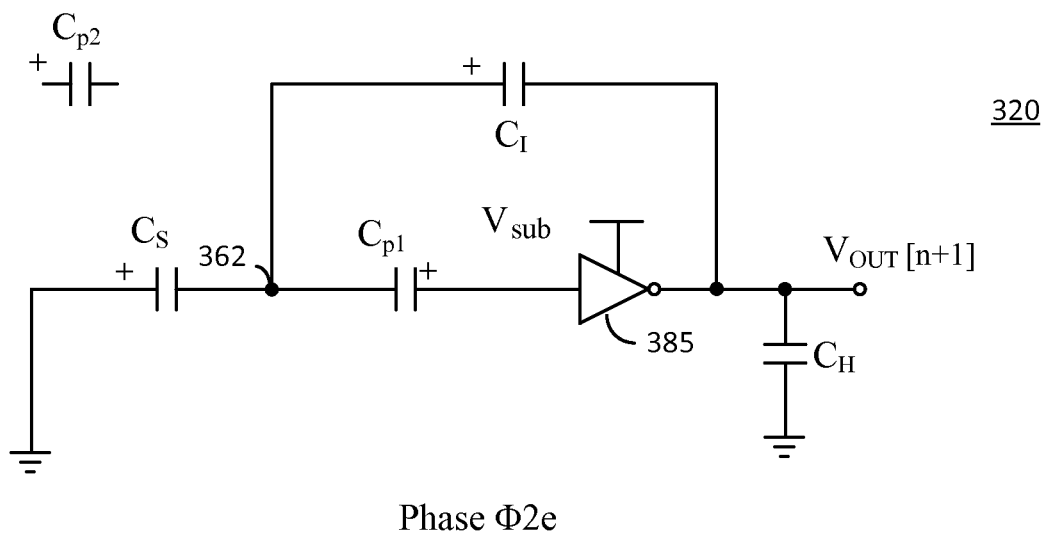

As shown in FIGS. 6B and 6D, during each update cycle, the switches configure the loop filter 320 into a feedback circuit that outputs a voltage change $\Delta V_{OUT}$ for that cycle to the output capacitor $C_H$. The voltage of the output capacitor $C_H$ provides the voltage input to the VCO 130. The voltage change $\Delta V_{OUT}$ changes the voltage of the output capacitor $C_H$ in each cycle, and therefore adjusts the voltage input to the VCO 130.

In each update cycle, the feedback circuit comprises the feedback capacitor $C_r$ having one terminal coupled to the output of the inverter 385 and another terminal coupled to node 362. This is done by closing switch 365. The feedback circuit also comprises the integral capacitor $C_S$ couple between node 362 and ground by closing switch 355, and one of the proportional capacitors $C_{P1}$ and $C_{P2}$ coupled between the input of the inverter 385 and node 362. The proportional capacitors $C_{P1}$ and $C_{P2}$ are alternately coupled into the feedback circuit. For example, in phase $\Phi 2o$ of cycle n (shown in FIG. 6B), the second proportional capacitors $C_{P2}$ is coupled between the input of the inverter 385 and node 362 by closing switches 335 and 340. In phase $\Phi 2e$ of cycle n+1 (shown in FIG. 6D), the first proportional capacitors $C_{P1}$ is coupled between the input of the inverter 385 and node 362 by closing switches 315 and 320. Thus, the first and second proportional capacitor $C_{P1}$ and $C_{P2}$ are coupled into the feedback circuit in alternate update cycles. When one of the proportional capacitors $C_{P1}$ and $C_{P2}$ is coupled into the feedback circuit, the other one of the proportional capacitors is electrically isolated from the feedback circuit, as shown in FIGS. 6B and 6D.

The transfer function for the loop filter 320 can be expressed in terms of cycle n and cycle n+1 as follows:

$$\Delta V_{OUT}[n+1] = Q_{INT}[n+1]/C_I + (C_S+C_I)/(C_c C_I)/(Q_{PROP}[n+1] - Q_{PROP}[n]) + (V_{OFF}[n+1] - V_{OFF}[n]) \quad \text{Eq. (1)}$$

where it is assumed that $C_{P1} = C_{P2} = C_c$.

Thus, the transfer function for the loop filter includes an integral term (i.e., $Q_{INT}[n+1]/C_I$) that is proportional to the integral charge in the current cycle ($Q_{INT}[n+1]$), and a proportional term (i.e., $(C_S+C_I)/(C_c C_I)/(Q_{PROP}[n+1] - Q_{PROP}[n])$) that is proportional to the difference between the proportional charge in the current cycle ($Q_{PROP}[n+1]$) and the proportional charge in the previous cycle ($Q_{PROP}[n]$).

The transfer function also includes a differential term equal to the difference between the offset voltage $V_{OFF}$ in the current cycle and the offset voltage $V_{OFF}$ in the previous cycle (i.e., $V_{OFF}[n+1] - V_{OFF}[n]$). As discussed above, the offset voltage includes flicker noise from the active elements of the inverter 385. The flicker noise has a much lower frequency compared to the frequency of the reference signal (which is the same as the up/down frequencies when the PLL is locked), the flicker noise is relatively constant between two consecutive cycles. As a result, by taking the difference between the offset voltage $V_{OFF}$ in two consecutive cycles, the loop filter 220 effectively filters out (suppresses) the flicker noise.

Figure 7:
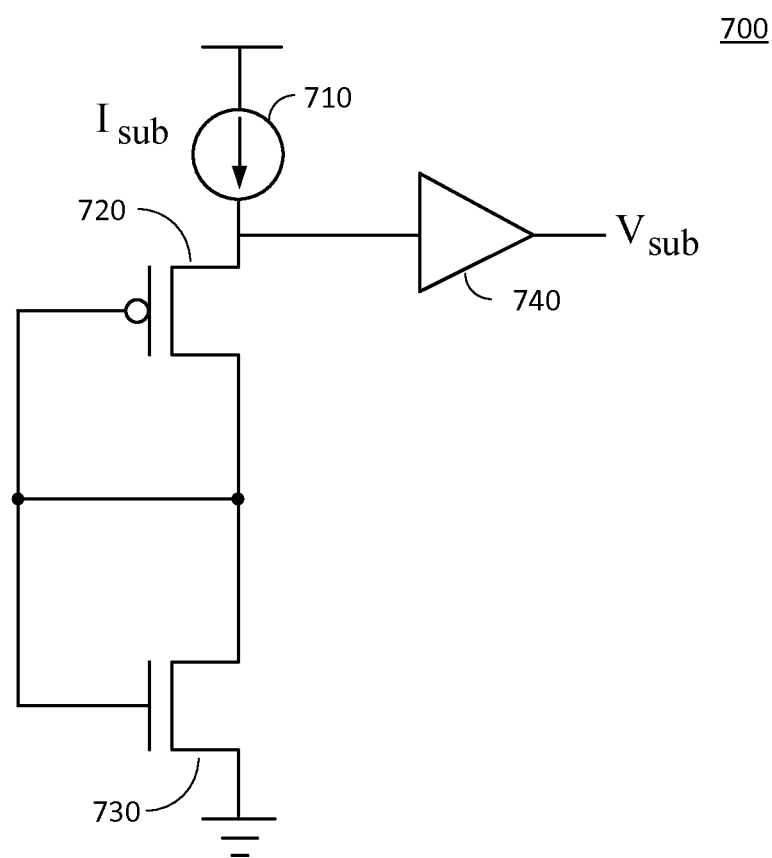
FIG. 7 shows a sub-threshold bias circuit according to an embodiment of the present disclosure.

To reduce power consumption, the transistors (e.g., transistors 410 and 420) in the inverter 385 can be biased to operate in the sub-threshold region. In this regard, FIG. 7 shows a bias circuit 700 for biasing the transistors of the inverter 385 in the sub-threshold region. The bias circuit 700 comprises a sub-threshold current source 710, a PMOS transistor 720, a NMOS transistor 730, and a voltage regulator 740. The PMOS transistor 720 and the NMOS transistor 730 are diode-connected, in which the drain and gate of each transistor are shorted.

The sub-threshold current source 710 provides a sub-threshold current that flows though the PMOS transistor 720 and the NMOS transistor 730. The sub-threshold current causes both transistors 720 and 730 to operate in the sub-threshold region, and therefore the voltage across each transistor to correspond to the sub-threshold region. The sum of the voltages across the two transistors 720 and 730 produces a sub-threshold bias voltage $V_{sub}$, which is input to voltage regulator 740. The voltage regulator 740 outputs the sub-threshold bias voltage $V_{sub}$ to the inverter 385 and provides current driving capability for driving large transient currents to the inverter 385. The voltage regulator 740 also improves power supply rejection for the inverter amplifier. The sub-threshold bias voltage $V_{sub}$ is applied to a power input of the inverter 385 (shown in FIG. 3), in which the sub-threshold bias voltage $V_{sub}$ biases the transistors of the inverter 385 in the sub-threshold region, thereby reducing power consumption. The sub-threshold bias voltage $V_{sub}$ may be used to power the inverter 485 shown in FIG. 4, the inverter 585 shown in FIG. 5, or another type of inverter.

In addition, the bias circuit 700 is able to adjust the sub-threshold bias voltage $V_{sub}$ to account for process-voltage-temperature (PVT) variations. This is because the voltages across the transistors 720 and 730 (which produce the sub-threshold bias voltage $V_{sub}$) change due to PVT variations, and the transistors in the inverter 385 experience similar PVT variations, assuming the transistors in the inverter 385 and the bias circuit 700 are fabricated on the same chip (die) and in close proximity to each other. As a result, changes in the voltages across the transistors 720 and 730 due to PVT variations account for similar PVT variations in the transistors in the inverter 385.

Figure 8:
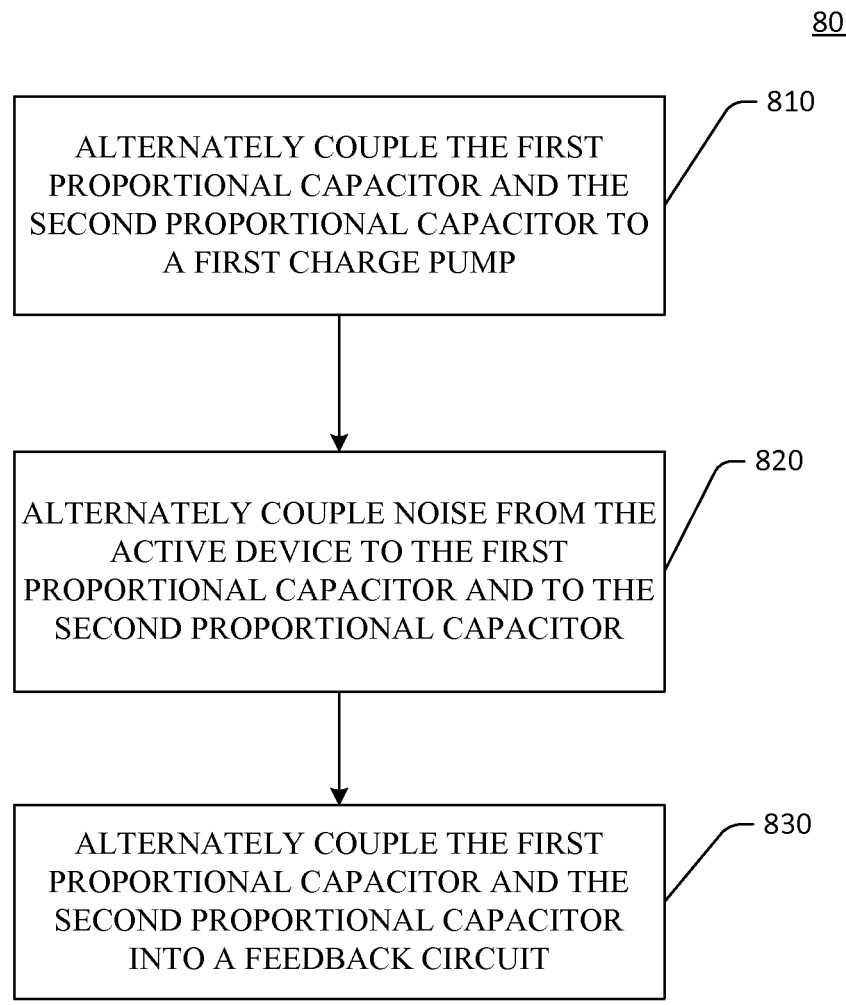
FIG. 8 is a flowchart illustrating a method for operating a loop filter of a PLL according to certain embodiments of the present disclosure.

FIG. 8 is a flow diagram of a method 800 for operating a loop filter of a PLL according to an embodiment of the present disclosure. The loop filter (e.g., switched-capacitor loop filter 320) comprises a first proportional capacitor (e.g., the first proportional capacitor $C_{P1}$), a second proportional capacitor (e.g., the second proportional capacitor $C_{P2}$), and an active device (e.g., the inverter 385).

In step 810, the first proportional capacitor and the second proportional capacitor are alternately coupled to a first charge pump. For example, the first proportional capacitor and the second proportional capacitor may be coupled to the first charge pump (e.g., the first charge pump 115) in alternate update cycles.

In step 820, noise from the active device is alternately coupled to the first proportional capacitor and the second proportional capacitor. For example, the voltages of the first proportional capacitor and the second proportional capacitor may be reset to the offset voltage of the active device in alternate update cycles, in which the offset voltage includes flicker noise of the active device.

In step 830, the first proportional capacitor and the second proportional capacitor are alternately coupled into a feedback circuit, wherein the feedback circuit produces an output voltage of the loop filter. For example, the first proportional capacitor and the second proportional capacitor may be coupled into the feedback circuit in alternate update cycles.

Those skilled in the art would appreciate that the circuits described herein may be realized using a variety of transistor types, and are therefore not limited to the particular transistor types shown in the figures. For example, transistor types such as bipolar junction transistors, junction field effect transistor or any other transistor type may be used. Those skilled in the art would also appreciate that the circuits described herein may be fabricated with various IC process technologies such as CMOS, bipolar junction transistor (BJT), bipolar-CMOS (BiCMOS), silicon germanium (SiGe), gallium arsenide (GaAs), etc.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A loop filter for a phased-locked loop (PLL), comprising:
   a first proportional capacitor;
   a second proportional capacitor;
   an active device; and
   a plurality of switches configured to alternately couple the first proportional capacitor and the second proportional capacitor to a first charge pump, to alternately couple noise from the active device to the first proportional capacitor and the second proportional capacitor, and to alternately couple the first proportional capacitor and the second proportional capacitor into a feedback circuit, wherein the feedback circuit produces an output voltage of the loop filter.

2. The loop filter of claim 1, wherein the output voltage of the loop filter is coupled to an input of a voltage-controlled oscillator (VCO).

3. The loop filter of claim 1, wherein the active device comprises an inverter, and the plurality of switches are configured to couple noise from the active device to one of the first and second proportional capacitors by shorting an input and an output of the inverter, and coupling the one of the first and second proportional capacitors to the input of the inverter.

4. The loop filter of claim 1, further comprising an integral capacitor, wherein the plurality of switches are configured to couple the integral capacitor to a second charge pump during each update cycle, and to couple the integral capacitor into the feedback circuit during each update cycle.

5. The loop filter of claim 4, further comprising a feedback capacitor, wherein the plurality of switches are configured to form the feedback circuit by coupling a first terminal of the feedback capacitor to an output of the active device and a second terminal of the feedback capacitor to a node, coupling the integral capacitor to the node, and alternately coupling the first proportional capacitor and the second proportional capacitor between the node and an input of the active device.

6. The loop filter of claim 1, wherein, when the plurality of switches couple one of the first and second proportional capacitors to the first charge pump, the plurality of switches couple the noise from the active device to the other one of the first and second proportional capacitors.

7. The loop filter of claim 1, wherein, when the plurality of switches couple one of the first and second proportional capacitors into the feedback circuit, the plurality of switches electrically isolate the other one of the first and second proportional capacitors from the feedback circuit.

8. The loop filter of claim 1, further comprising a voltage-bias circuit for biasing the active device, the voltage-bias circuit comprising:
   at least one transistor; and
   a sub-threshold current source configured to produce a sub-threshold current that flows through the at least one transistor, wherein the sub-threshold current causes the at least one transistor to operate in a sub-threshold region;
   wherein a voltage across the at least one transistor provides a bias voltage for the active device.

9. The loop filter of claim 8, further comprising a voltage regulator coupled to the at least one transistor, wherein the voltage regulator is configured to output the bias voltage to the active device and to drive current to the active device.

10. The loop filter of claim 8, wherein the active device comprises an inverter.

11. A method for operating a loop filter, the loop filter comprising a first proportional capacitor, a second proportional capacitor, and an active device, the method comprising:
   alternately coupling the first proportional capacitor and the second proportional capacitor to a first charge pump;
   alternately coupling noise from the active device to the first proportional capacitor and the second proportional capacitor; and
   alternately coupling the first proportional capacitor and the second proportional capacitor into a feedback circuit, wherein the feedback circuit produces an output voltage of the loop filter.

12. The method claim 11, wherein the active device comprises an inverter, and alternately coupling noise from the active device to the first proportional capacitor and the second proportional capacitor further comprises:
   shorting an input and an output of the inverter; and
   coupling one of the first and second proportional capacitors to the input of the inverter.

13. The method of claim 11, wherein the loop filter further comprises an integral capacitor, and the method further comprises:
   coupling the integral capacitor to a second charge pump during each update cycle; and
   coupling the integral capacitor into the feedback circuit during each update cycle.

14. The method of claim 13, wherein the loop filter further comprises a feedback capacitor, and the method further comprises:
   forming the feedback circuit by performing the steps of:
      coupling a first terminal of the feedback capacitor to an output of the active device and a second terminal of the feedback capacitor to a node;
      coupling the integral capacitor to the node; and
      alternately coupling the first proportional capacitor and the second proportional capacitor between the node and an input of the active device.

15. The method of claim 11, further comprising electrically isolating one of the first and second proportional capacitors from the feedback circuit when the other one of the first and second proportional capacitors is coupled into the feedback circuit.

16. An apparatus for operating a loop filter, the loop filter comprising a first proportional capacitor, a second proportional capacitor, and an active device, the apparatus comprising:
   means for alternately coupling the first proportional capacitor and the second proportional capacitor to a first charge pump;
   means for alternately coupling noise from the active device to the first proportional capacitor and the second proportional capacitor; and
   means for alternately coupling the first proportional capacitor and the second proportional capacitor into a feedback circuit, wherein the feedback circuit produces an output voltage of the loop filter.

17. The apparatus of claim 16, wherein the active device comprises an inverter, and the means for alternately coupling noise from the active device to the first proportional capacitor and the second proportional capacitor further comprises:
   means for shorting an input and an output of the inverter; and
   means for coupling one of the first and second proportional capacitors to the input of the inverter.

18. The apparatus of claim 17, wherein the loop filter further comprises an integral capacitor, and the apparatus further comprises:
   means for coupling the integral capacitor to a second charge pump during each update cycle; and
   means for coupling the integral capacitor into the feedback circuit during each update cycle.

19. The apparatus of claim 18, wherein the loop filter further comprises a feedback capacitor, and the apparatus further comprises:
   means for forming the feedback circuit, wherein the means for forming the feedback circuit comprises:
      means for coupling a first terminal of the feedback capacitor to an output of the active device and a second terminal of the feedback capacitor to a node;
      means for coupling the integral capacitor to the node; and
      means for alternately coupling the first proportional capacitor and the second proportional capacitor between the node and an input of the active device.

20. The apparatus of claim 16, further comprising means for electrically isolating one of the first and second proportional capacitors from the feedback circuit when the other one of the first and second proportional capacitors is coupled into the feedback circuit.

* * * * *